United States Patent
Lee et al.

(10) Patent No.: US 6,964,900 B2
(45) Date of Patent: Nov. 15, 2005

(54) CAPACITOR IN SEMICONDUCTOR DEVICE HAVING DUAL DIELECTRIC FILM STRUCTURE AND METHOD FOR FABRICATING THE SAME

(75) Inventors: Kee Jeung Lee, Seoul (KR); Byung Seop Hong, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 210 days.

(21) Appl. No.: 10/331,016

(22) Filed: Dec. 27, 2002

(65) Prior Publication Data

US 2003/0199137 A1 Oct. 23, 2003

(30) Foreign Application Priority Data

Apr. 23, 2002 (KR) ................ 10-2002-0022117

(51) Int. Cl.⁷ .......................... H01L 21/8242
(52) U.S. Cl. ................ 438/253; 438/634; 427/248.1; 361/321.4
(58) Field of Search ................ 438/253, 634; 427/248.1, 79; 361/321.4, 321.5, 305; 257/306

(56) References Cited

U.S. PATENT DOCUMENTS

| | | | | |
|---|---|---|---|---|
| 4,423,087 A | * | 12/1983 | Howard et al. | 427/79 |
| 4,471,405 A | * | 9/1984 | Howard et al. | 361/305 |
| 5,754,390 A | * | 5/1998 | Sandhu et al. | 361/321.4 |
| 6,075,691 A | * | 6/2000 | Duenas et al. | 361/321.5 |
| 6,222,219 B1 | * | 4/2001 | Gambino et al. | 257/306 |
| 6,555,166 B2 | * | 4/2003 | Gluschenkov et al. | 427/248.1 |

* cited by examiner

*Primary Examiner*—Laura M Schillinger
(74) *Attorney, Agent, or Firm*—Ladas & Parry LLP

(57) ABSTRACT

A capacitor in a semiconductor device having a dual dielectric film structure and a fabrication method therefor are disclosed. The capacitor comprises: a lower electrode formed on a semiconductor substrate, a dielectric film of a dual dielectric film structure composed of an $Si_3N_4$ chloride-free thin film and a $Ta_2O_5$ thin film, which is formed on the lower electrode, and an upper electrode formed on the dielectric film. Meanwhile, the method for fabricating the capacitor comprises the steps of: forming a lower electrode on a semiconductor substrate, forming a dielectric film of a dual dielectric film structure composed of an $Si_3N_4$ thin film and a $Ta_2O_5$ thin film on the lower electrode, and forming an upper electrode on the dielectric film.

10 Claims, 4 Drawing Sheets

CAPACITOR IN SEMICONDUCTOR DEVICE HAVING DUAL DIELECTRIC FILM STRUCTURE AND METHOD FOR FABRICATING THE SAME

BACKGROUND OF THE INVENTION

1. Field of the Invention

The present invention relates to a method for fabricating a capacitor in a semiconductor device, and more particularly to a method for fabricating a capacitor in a semiconductor device having a dual dielectric film structure composed of $Ta_2O_5/Si_3N_4$, and a capacitor fabricated thereby.

2. Description of the Prior Art

Recently, as high integration of memory products has become accelerated following the development of microscopic fabrication process technologies for semiconductors, unit cell area is largely decreased and driving voltage has been lowered considerably.

However, the necessary capacity of the capacitor for the driving of memory elements is required to increase above 25 fF per cell so as to suppress the contraction of the refresh time and to prevent the occurrence of soft errors, despite the reduction of the cell area.

Accordingly, recently a three dimensional type electrical charge storage electrode with hemispheric structure having a large surface area has been used for DRAM capacitor elements which utilize a nitride layer with a nitride layer/oxide layer (N/O) structure as a dielectric, and the height of the capacitor has been increased steadily.

Meanwhile, a depth of focus is not assured in the following exposure process due to the differences of height produced between a cell region and a peripheral circuit region when the height of the capacitor increases, which results in a bad effect upon the integration process which follows the wiring process.

As stated above, conventional N/O capacitor element comes to a limitation in assuring charging capacity of a capacitor requisite for future DRAM products such as those are over 256 M. As a result, as shown in FIGS. 1A to 1D, a capacitor made of $Ta_2O_5$ has been actively developed.

Referring to FIGS. 1A to 1D, a conventional fabricating method for a capacitor in a semiconductor device using a $Ta_2O_5$ dielectric film will be described as follows.

FIGS. 1A to 1D are sectional views illustrating steps of a fabricating method for a capacitor in a semiconductor device in accordance with the prior art.

According to the fabricating method of the prior art for a capacitor for a semiconductor device, as shown in FIG. 1A, an interlayer insulating film 3 is first deposited over a semiconductor substrate 1, photo-sensitive materials are distributed on the interlayer insulating film, and a first photo-mask (not shown) for making plug contacts is formed by carrying out an exposure process and a developing process using photolithography technology, and carrying out a selective patterning of the interlayer insulating film.

Then, a plug contact hole 5 exposing a portion of the semiconductor substrate 1 is formed by patterning the interlayer insulating film 3 with a first photo-mask (not shown), and then the first photo-mask is removed.

Subsequently, conductive materials are deposited on the plug contact hole 5 and the first interlayer insulating film 3, and a chemical-mechanical polishing (CMP) is carried out, resulting in the formation of a contact plug 7 in the plug contact hole 5.

Referring to FIG. 1B, a second interlayer insulating film 9 is deposited on an entire surface of the semiconductor substrate 1, and then photo-sensitive materials are distributed on the second interlayer insulating film 9, and a second photo-mask (not shown) for making plug contacts is formed by carrying out an exposure process and a developing process using photolithography technology and carrying out a selective patterning of the second interlayer insulating film.

Then, a contact hole 11 defining a lower electrode region is formed in the second interlayer insulating film 9 over the contact plug 7 by patterning of the second interlayer insulating film 9 with the second photo-mask (not shown), and then the second photo-mask (not shown) is removed.

Subsequently, a doped polysilicon layer (not shown) is deposited on the second interlayer insulating film 9 inclusive of the contact hole 11, and photo-sensitive materials are distributed thereon. In this instance, the production process of the polysilicon layer (not shown) is carried out by utilizing a LPCVD chamber so as to employ a capacitor module with a cylindrical structure or a concave structure as a lower electrode.

Then, a lower electrode 13 of cylindrical shape is formed by removing the photo-sensitive materials and the second interlayer insulating film 9 remaining after the CMP processing of the photo-sensitive materials and the doped polysilicon layer (not shown), the lower electrode being contacted with the contact plug 7. In this instance, a lower electrode having a concave structure can be formed in place of the cylindrical structure. In the above case, it is possible to remove just the photo-sensitive materials in order to form a lower electrode in the shape of concave structure after carrying out the CMP processing of the photo-sensitive materials and the doped polysilicon layer (not shown).

FIG. 1C shows the lower electrode 13 remaining after the removal of the photo-sensitive materials.

Referring now to FIG. 1D, a $Ta_2O_5$ thin film 15 is deposited on the lower electrode 13 and a TiN film for an upper electrode 17 is deposited on the thin film 15, thereby fabricating a capacitor in a semiconductor device. Furthermore, a doped poly-silicon layer, which functions as a buffer layer, can be deposited on the upper electrode 17 so as to secure structural stability and enhance the endurance property of the upper electrode against the thermal or electrical influences.

However, according to the above-noted prior art, vacancy atoms Ta arising from the differences of the composition ratio between Tantalum (Ta) and Oxygen (O) exist in the thin film, because the $Ta_2O_5$ thin film has an unstable stoichiometry.

Furthermore, carbon atoms and carbon compounds (C, $CH_4$, $C_2H_2$, etc), which are impurities, and water ($H_2O$) exist together in the thin film, due to reaction of the organic compound $Ta(OC_2H_5)_5$, which is a precursor of $Ta_2O_5$, with $O_2$ (or $N_2O$) gas at the time of the formation of the thin film.

As a result, leakage current increases due to carbon atoms, ions and radicals that exist as impurities in the $Ta_2O_5$ thin film, and the dielectric properties become deteriorated and damaged.

As regards an $Si_3N_4$ ($\epsilon=7$) dielectric film which is deposited by using DCS (Di-Chloro-Silane) gas, because the dielectric ratio is so low that it is limited in use as capacitor dielectric film of highly integrated semiconductor products, wherein a microscopic wiring process is employed for elements such as those below 0.16 $\mu$m, therefore a $Ta_2O_5$ ($\epsilon=25$) dielectric film with a bigger dielectric ratio than previously has come to be employed.

However, as stated above, although the dielectric ratio of the $Ta_2O_5$ thin film is big itself, during the high temperature oxidation process which follows the deposition of $Ta_2O_5$ in the fabrication process of a capacitor, an interface oxide film ($Si_2O$, $\epsilon=3.85$) having a low dielectric ratio is deposited on the surface of a polysilicon layer, which functions as a lower electrode, so as to solve the problems which originate from the $Ta_2O_5$ thin film itself. Therefore, the thickness of the oxidation film can not be lowered to below 30 Å, resulting in limitations in achieving a large charging capacity for a capacitor.

SUMMARY OF THE INVENTION

Accordingly, the present invention has been made to solve the above-mentioned problems occurring in the prior art, and an object of the present invention is to provide a capacitor in a semiconductor device with a dual dielectric film structure, which is capable of providing larger charging capacity for a capacitor than a conventional dielectric material by employing a dual dielectric film composed of a $Ta_2O_5/Si_3N_4$ thin film structure, and can effectively suppress the occurrence of leakage current, thereby being suitable for a highly integrated semiconductor device, and a fabrication method therefor.

In order to accomplish this object in accordance with one aspect of the present invention, there is provided a method for fabricating a capacitor in a semiconductor device with a dual dielectric film, comprising the steps of: forming a lower electrode on a semiconductor substrate, forming a dielectric film of a dual dielectric film structure which is composed of an $Si_3N_4$ chloride-free thin film and a $Ta_2O_5$ thin film and is formed on the lower electrode, and forming an upper electrode on the dielectric film.

In accordance with another aspect of the present invention, there is provided a capacitor in a semiconductor device having a dual dielectric film, the capacitor comprising: a lower electrode formed on a semiconductor substrate, a dielectric film of a dual dielectric film structure composed of an $Si_3N_4$ thin film and a $Ta_2O_5$ thin film, which is formed on the lower electrode, and an upper electrode formed on the dielectric film.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

FIGS. 2A to 2D are sectional views illustrating each step in a method for fabricating a capacitor in a semiconductor device having a dual dielectric film structure in accordance with the present invention.

Figure 1A:
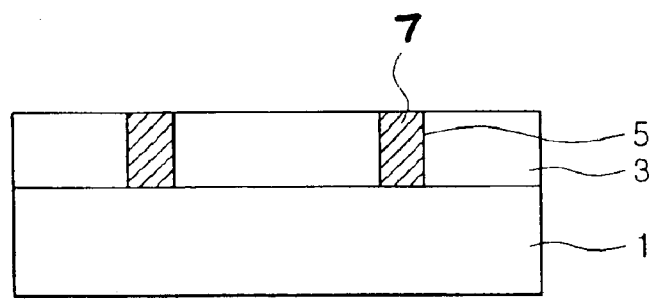
FIGS. 1A to 1D are sectional views illustrating each step in a method for fabricating a capacitor in a semiconductor device in accordance with the conventional art.
Figure 1B:
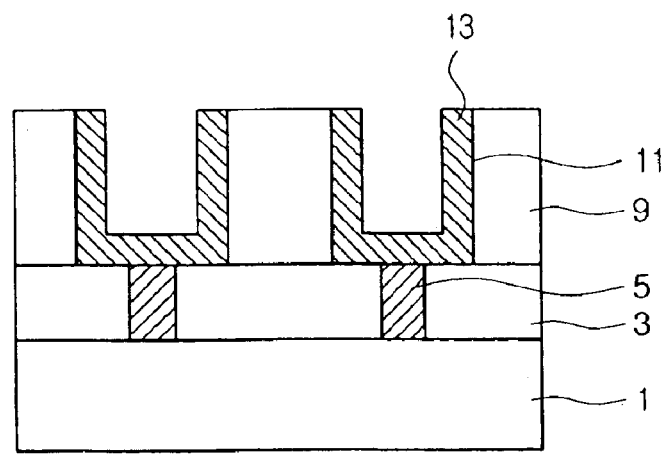
Figure 1C:
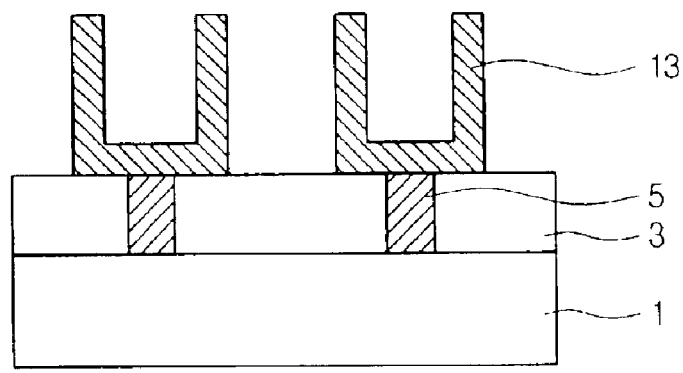
Figure 1D:
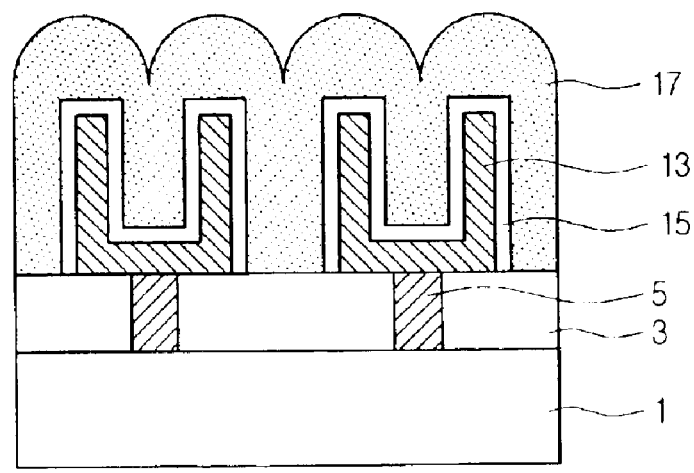
Figure 2A:
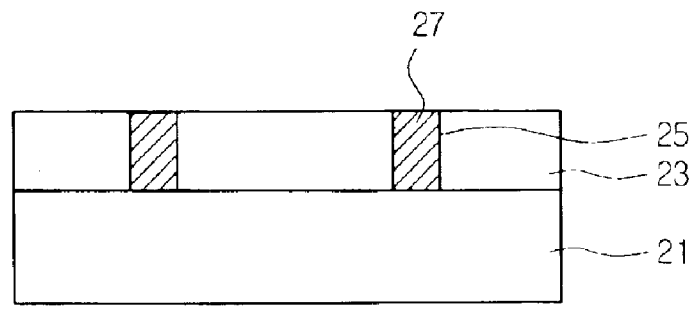
FIGS. 2A to 2D are sectional views illustrating each step in a method for fabricating a capacitor in a semiconductor device having a dual dielectric film structure in accordance with the present invention.

In accordance with one embodiment of the present invention, as shown in FIG. 2A, a first interlayer insulating film 23 is first deposited on a semiconductor substrate 21, and then photo-sensitive materials are distributed thereon and a first photo-mask (not shown) for making a plug contact is formed by carrying out an exposure process and a developing process using photolithography technology and selective patterning of photo-sensitive materials.

Next, a plug contact hole 25, which exposes a portion of the semiconductor substrate 21, is formed by patterning of the first interlayer insulating film 23 using the first photo-mask (not shown) as a mask, and then the first photo-mask (not shown) is removed.

Subsequently, conductive materials are deposited over the plug contact hole 25 and the first interlayer insulating film 23, and then CMP process is carried out to result in forming of a contact plug 27 in the plug contact hole 25.

Figure 2B:
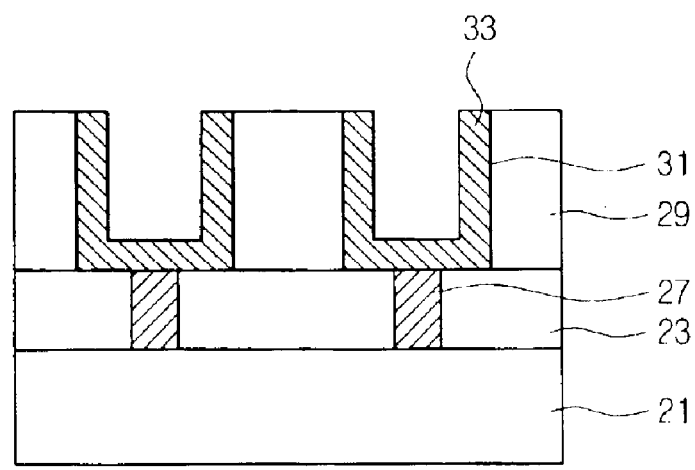

Referring now to FIG. 2B, a second interlayer insulating film 29 is deposited on the entire surface of the semiconductor structure and photo-sensitive materials are distributed thereon, then, a second photo-mask (not shown) is formed by carrying out an exposure process and a developing process using photolithography technology and selective patterning of photo-sensitive materials.

Next, a contact hole 31 defining a lower electrode region is formed in the second interlayer insulating film 29 over the contact plug 27 by patterning of the second interlayer insulating film 29 with the second photo-mask (not shown) as a mask, and then the second photo-mask (not shown) is removed.

Subsequently, a doped polysilicon layer (not shown) is deposited on the second interlayer insulating film 29, inclusive of the contact hole 31, and photo-sensitive materials are distributed thereon. In this instance, the production process of the polysilicon layer (not shown) is carried out by employing a LPCVD chamber so as to use a capacitor module in the shape of a cylindrical structure, a stacked structure or a concave structure as a lower electrode.

Then, a lower electrode 33 of the cylindrical shape is formed by removing the photo-sensitive materials and the second interlayer insulating film 29 remaining after the CMP process of removing the photo-sensitive materials and the doped polysilicon layer (not shown), the lower electrode being contacted with the contact plug 7. In this instance, a lower electrode with a concave structure can be formed in place of that having a cylindrical structure. In the above case, it is possible to remove just photo-sensitive materials to form a lower electrode in the shape of concave structure after carrying out the CMP process of removing the photo-sensitive materials and the doped polysilicon layer (not shown).

Figure 2C:
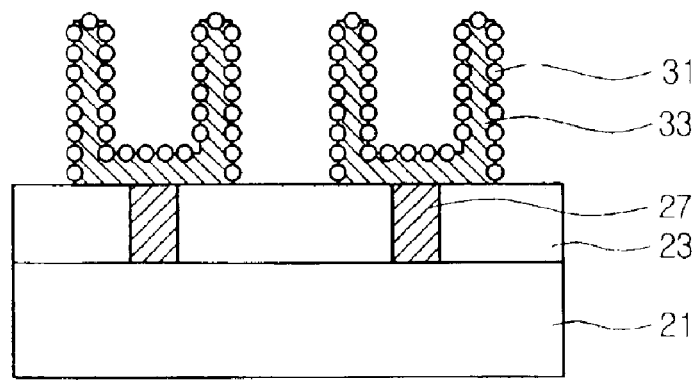

Referring now to FIG. 2C, a polysilicon layer 35 of hemi-spherical grain (HSG) shape is formed on a surface of the lower electrode 33 so as to increase the value of charging capacity for a capacitor, resulting in an increase of the area of the lower electrode 33.

Figure 2D:
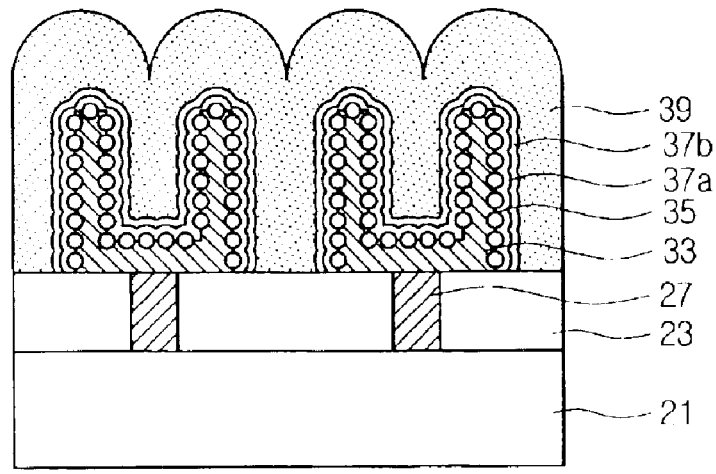

Next, as shown in FIG. 2D, a first $Si_3N_4$ dielectric chloride-free thin film 37a is chemical vapor deposited on the lower electrode 33, by reacting a surface of the polysilicon layer on the lower electrode 33, at a temperature of 550 to 700° C. and under an atmosphere of $NH_3$ gas in an LP-CVD single chamber of an in-situ or ex-situ arrangement or in an electric furnace, with vaporized gas made of BTBAS [bis (tertiary-butylamino-silane)]. The first $Si_3N_4$ dielectric thin film is formed so as to avoid formation of an oxide layer with a low dielectric ratio due to formation of natural oxide film ($Si_2O$) on the surface of the polysilicon layer in the shape of hemispherical grain, and to minimize formation of the oxide film with a low dielectric ratio, which is formed during successive depositing processes of $Si_3N_4$ chloride-free thin film.

The first $Si_3N_4$ dielectric thin film 37a is deposited as stated above to a thickness of 10 to 20 Å through a surface chemical reaction which occurs on the semiconductor substrate, and subsequently a second $Ta_2O_5$ dielectric thin film 37b is deposited to a thickness of 50 to 100 Å.

Alternatively, after a polysilicon layer is formed to act as a lower electrode 33, the first $Si_3N_4$ dielectric thin film 37a may be deposited on the lower electrode after removing the natural oxide film using a HF vapor or a HF solution in an in-situ or ex-situ chamber. Also, the first $Si_3N_4$ dielectric thin film 37a may be deposited on the lower electrode after cleaning an interface before and after carrying out surface treatment of the polysilicon layer using a HF compound, or after cleaning the interface using an $NH_4OH$ or $H_2SO_4$ solution, etc., so as to enhance uniformity. In this instance, the source for silicon nitride is $SiH_2[NH (C_4H_9)]_2$;BTBAS [bis (tertiary-butylamino-silane)] in liquid state, when the first $Si_3N_4$ dielectric chloride-free thin film has been deposited.

Furthermore, the source gas for the $Si_3N_4$ dielectric chloride-free thin film is obtained through the vaporization of proper amounts of BTBAS solution at a temperature range of 166 to 200° C., which is supplied to an evaporizer or an evaporation tube by means of a flow controller such as a LMFC (liquid mass flow controller).

In this instance, the $Si_3N_4$ dielectric chloride-free thin film is chemical vapor deposited to a thickness of 10 to 30 Å, preferably 15 to 20 Å, while maintaining the temperature range of 550 to 700° C., the pressure range of 0.1 to 5 torr, preferably 0.2 to 0.5 torr, and the flow rate ($NH_3$/BTBAS) of $NH_3$ reaction gas to BTBAS at 1 to 10, preferably 50 to 200 cc of $NH_3$ against 20 to 100 cc for BTBAS.

Furthermore, the second amorphous $Ta_2O_5$ thin film 37b is deposited to a proper thickness of 50 to 100 Å by means of a CVD or an ALD method after the formation of the first $Si_3N_4$ thin film, and then these dielectric thin films are subjected to annealing using an electric furnace under an atmosphere of $N_2O$ ($N_2$ or $O_2$) gas at 700 to 800° C. temperature for 5 to 120 minutes, thereby inducing crystallization. In this instance, crystallization can be induced by subjecting the dielectric films to annealing under an atmosphere of $N_2O$ (or $O_2$) gas at 800 to 900° C. temperature for 30 to 120 minutes using an RTP (Rapid Thermal Process) in place of an electric furnace.

Also, the second $Ta_2O_5$ dielectric film 37b is deposited by means of a CVD or an ALD method under a temperature of 800 to 900° C. and a pressure of 0.1 to 5 torr using an organic metal compound such as tantalum ethylate $[Ta(OC_2H_5)_5]$ or penta-dimethyl-amino-tantalum $[Ta(N(CH_3)_2)_5]$ as a precursor.

In this instance, a Ta chemical vapor is obtained through the vaporization of proper amounts of a tantalum ethylate $[Ta(OC_2H_5)_5]$ solution or a penta-dimethyl-amino-tantalum $[Ta(N(CH_3)_2)_5]$ at a temperature range of 150 to 200° C., which is supplied to an vaporizer or an evaporation tube by way of a flow controller such as an MFC (mass flow controller).

Then, a TiN layer is deposited on the entire surface of the semiconductor device as an upper electrode 39 or formed simultaneously with a doped polysilicon layer as a buffer layer on the upper electrode so as to secure structural stability and to enhance the endurance properties of the upper electrode against thermal or electrical influences, thereby incorporating a capacitor for a semiconductor device. In this instance, the upper electrode 39 is made of metallic materials such as TiN, TaN, W, WN, Ru, $RuO_2$, Ir, $IrO_2$, Pt, etc., together with the doped polysilicon layer. Also, the upper electrode made of metallic material is formed through using a PE-CVD method, a RF magnetic sputtering method, a CVD method or an ALD method.

As explained above, according to the method for fabricating a capacitor in a semiconductor device having a dual dielectric film structure of the present invention, following advantages are achieved.

According to the method for fabricating a capacitor in a semiconductor device having a dual dielectric film structure of the present invention, the capacitor in the semiconductor device is fabricated by using $Si_3N_4$ chloride-free thin film as the first dielectric film and deposited by using BTBAS [bis(tertiary-butylamino-silane)]. Accordingly, the oxide film having a low dielectric ratio and arising from the oxidation of the lower electrode at the time of fabricating a conventional capacitor, inclusive of the $Ta_2O_5$ thin film ($\epsilon$=25), can be substantially avoided. Also, the thickness (Tox) of the oxide film of the capacitor can be controlled to be below 30 Å.

Also, the $Si_3N_4$ chloride-free thin film deposited by using BTBAS is stronger in an oxidation persistent property than the $Ta_2O_5$ thin film at the time of being subjected to a high temperature oxidation treatment after the deposition of $Ta_2O_5$. Accordingly, the $Si_3N_4$ thin film can act as a diffusion barrier against activated oxygen. As a result, it is more preferable to deposit the $Ta_2O_5$ thin film to a thickness of at least 100 Å so as to fabricate the capacitor in the semiconductor device so that a large capacitance for a capacitor can be secured. Accordingly, the $Si_3N_4$ chloride-free thin film can be employed for a capacitor in highly integrated products.

Furthermore, the capacitor having a dual dielectric film structure composed of the $Ta_2O_5/Si_3N_4$ thin film is useful for the fabrication process of highly integrated device, which is specifically vulnerable to a high temperature thermal budget process, because a high temperature nitrification treatment process such as RTN (Rapid Thermal Nitrification), which is carried out under temperature of 800 to 900° C. and an atmosphere of $NH_3$ in order to avoid the oxidation of the lower electrode as has been in the conventional fabrication process of a capacitor made of $Ta_2O_5$ thin film, is not required.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for fabricating a capacitor in a semiconductor device having a dual dielectric film structure, the method comprising the steps of:
    forming a lower electrode on a semiconductor substrate;
    forming a dielectric film with a dual dielectric film structure composed of an $Si_3N_4$ chloride-free thin film and a $Ta_2O_5$ thin film on the lower electrode;
    forming an upper electrode on the dielectric film, wherein $SiH_2[NH (C_4H_9)]_2$; BTBAS[bis(tertiary-butylamino-silane)] in liquid state is used as silicon nitride source, when the $Si_3N_4$ chloride-free thin film is deposited; and
    wherein a source gas for the $Si_3N_4$ chloride free thin film is obtained by vaporization of proper amounts of BTBAS solution at a temperature range of 166 to 200° C., which is supplied to an evaporizer or an evaporation tube by means of a flow controller such as a liquid mass flow controller (LMFC).

2. The method according to claim 1, wherein the lower electrode is made of a polysilicon layer and a hemispherical grain shape polysilicon layer.

3. The method according to claim 2, further comprising a step of forming a polysilicon layer and removing a natural oxide film using a HF vapor or a HF solution in an in-situ or an ex-situ arrangement, prior to forming a dual dielectric film composed of a $Ta_2O_5$ thin film and a $Si_3N_4$ chloride-free thin film on the lower electrode.

4. The method according to claim 3, further comprising a step of cleansing an interface of the polysilicon layer using a $NH_4OH$ or a $H_2SO_4$ solution, before and after carrying out surface treatment of the polysilicon layer with a HF compounds.

5. The method according to claim 1, wherein the $Si_3N_4$ chloride-free thin film is chemical vapor deposited to a thickness of 10 to 30 Å while maintaining a temperature range of 550 to 700° C., a pressure range of 0.1 torr to 5 torr, and a flow rate ($NH_3$/BTBAS) of $NH_3$ reaction gas to BTBAS be at 1 to 10.

6. The method according to claim 1, wherein the second amorphous $Ta_2O_5$ thin film is deposited to a thickness of 50 to 100 Å by means of a CVD or an ALD method after the formation of first $Si_3N_4$ thin film, and then subjected to an annealing using an electric furnace under an atmosphere of $N_2O$ or $N_2$ or $O_2$ gas at 700 to 800° C. temperature for 5 to 120 minutes so as to induce crystallization.

7. The method according to claim 6, wherein crystallization is induced by subjecting the dielectric films to annealing under an atmosphere of $N_2O$ or $O_2$ gas at 800 to 900° C. temperature for 30 to 120 minutes using an RTP in place of the electric furnace.

8. The method according to claim 6, wherein the second $Ta_2O_5$ dielectric film is deposited by means of a CVD or an ALD method under a temperature of 800 to 900° C. and a pressure of 0.1 to 5 torr using an organic metal compound such as tantalum ethylate $[Ta(OC_2H_5)_5]$ or penta-dimethyl-amino-tantalum $[Ta(N(CH_3)_2)_5]$ as a precursor.

9. The method according to claim 6, wherein a Ta chemical vapor is obtained through the vaporization of proper amounts of tantalum ethylate $[Ta(OC_2H_5)]$ solution or penta-dimethyl-amino-tantalum $[Ta(N(CH_3)_2)_5]$ at a temperature range of 150 to 200° C., which is supplied to an evaporizer or an evaporation tube by way of a flow controller such as a MFC (mass flow controller).

10. The method according to claim 1, wherein the upper electrode is formed by depositing least metallic material selected from the group composed of TiN, TaN, W, WN, Ru, $RuO_2$, Ir, $IrO_2$, and Pt, together with a polysilicon layer.

* * * * *